United States Patent [19]

Teragaki

[11] Patent Number: 5,761,781
[45] Date of Patent: Jun. 9, 1998

[54] METHOD OF MANUFACTURING A PIEZOELECTRIC CERAMIC RESONATOR

[75] Inventor: Makoto Teragaki, Nagaokakyo, Japan

[73] Assignee: Murata Manufacturing Co., Ltd., Japan

[21] Appl. No.: 424,909

[22] Filed: Apr. 19, 1995

[30] Foreign Application Priority Data

Apr. 19, 1994 [JP] Japan .................................. 6-080515

[51] Int. Cl.⁶ ............................................ H01L 41/22
[52] U.S. Cl. ................................ 29/25.35; 310/312
[58] Field of Search ...................... 29/25.35; 310/312, 310/321

[56] References Cited

U.S. PATENT DOCUMENTS 4,649,310  3/1987  Nakamura et al. ............... 310/312 X

*Primary Examiner*—Carl E. Hall
*Attorney, Agent, or Firm*—Ostrolenk, Faber, Gerb & Soffen, LLP

[57] ABSTRACT

A method of manufacturing a piezoelectric ceramic resonator, comprising the steps a of preparing a piezoelectric ceramic plate, polarizing the piezoelectric ceramic plate, and adjusting an anti-resonance frequency of the piezoelectric ceramic plate, by lapping the same to adjust its thickness while measuring the anti-resonance frequency thereof. Preferably a homogeneous material is used as the piezoelectric ceramic plate in this manufacturing method.

4 Claims, 1 Drawing Sheet

METHOD OF MANUFACTURING A PIEZOELECTRIC CERAMIC RESONATOR

BACKGROUND OF THE INVENTION

1. Field of the Invention

The present invention relates to a method of manufacturing a piezoelectric ceramic resonator, and particularly, it relates to a method of manufacturing a piezoelectric ceramic resonator for obtaining a desired resonance frequency.

2. Description of the Prior Art

Conventionally, it is known that a resonator which utilises a shear vibration mode, such as a crystal resonator, a resonance frequency is determined by an element thickness, or a product of the element thickness t multiplied by the resonance frequency fr becomes a constant value C (t ×fr=C). And hence, when manufacturing a crystal resonator, which has a piezoelectric single crystal, in order to obtain a crystal plate having a desired resonance frequency, the element thickness of the crystal plate is adjusted by lapping the crystal plate using a well-known planetary gear type lapping machine (not shown).

That is the lapping of the crystal plate is carried out, as disclosed in Japanese Patent Application Laid Open No. Hei 3-251365, by the following method. After holding the crystal plate being lapped and incorporating a planetary gear-shaped carrier, which is thinner that the crystal plate, between a sun gear and an internal gear(annulus), lapping surface plates are arranged above and under the carrier, which is rotated while pouring a lapping slurry to grind the crystal plate and to obtain a desired resonance frequency.

In such lapping work, the resonance frequency of the crystal plate during the lapping work is measured through an electrode mounted on the lapping surface plate beforehand, and when the desired resonance frequency is reached, the lapping of the crystal plate is stopped.

However, though the above-mentioned conventional method is the practical method for manufacturing a crystal resonator, it has been difficult to use this conventional method for manufacturing a piezoelectric ceramic resonator.

The reason is that, an electromechanical coupling coefficient K of the piezoelectric ceramic plate as compared with the crystal plate is very large, or that a polarizability is large and a mechanical quality coefficient Qm is small.

That is, if a piezoelectric ceramic plate is lapped according to the conventional method by adjusting the resonance frequency while measuring the same, as a result of large fluctuations of the resonance frequency influenced by external capacitance variations, the relationship between the resonance frequency during the lapping work and the desired resonance frequency is not always constant.

Now, as a result of an assiduous study made by the inventor of the present invention to find a solution to this inconvenience, the inventor has found that the product of the element thickness t of the piezoelectric ceramic plate multiplied by the anti-resonance frequency fa becomes constant (t×fa=N), if the piezoelectric ceramic plate is made of a homogeneous material, and that the anti-resonance frequency is hardly affected by external capacitance variations. The inventor has also found that, when the resonance frequency is fr,$\Delta f = fa - fr$ is also constant.

And hence, when considering these relationships, since the difference between C and N is constant when $\Delta f$ is constant, the desired resonance frequency can be obtained by adjusting the anti-resonance frequency while measuring the same.

SUMMARY OF THE INVENTION

The present invention has been devised in view of the foregoing research, and is able to provide a very simple and practical method of manufacturing a piezoelectric ceramic resonator.

In order to achieve this, the method of manufacturing a piezoelectric ceramic resonator according to the present invention comprises the steps of preparing a piezoelectric ceramic plate, providing polarization treatment of the piezoelectric ceramic plate, and adjusting an anti-resonance frequency of the piezoelectric ceramic plate, by lapping the piezoelectric ceramic plate to adjust its thickness while measuring the anti-resonance frequency of the piezoelectric ceramic plate. In this method, as the piezoelectric ceramic plate, it is particularly preferable to use a homogeneous material.

According to the method of manufacturing a piezoelectric ceramic resonator according to the present invention, the piezoelectric ceramic plate having a desired resonance frequency can be obtained, by measuring the anti-resonance frequency of the piezoelectric ceramic plate during the lapping work and stopping the work when the anti-resonance frequency has reached a desired value.

Since the anti-resonance frequency during the lapping work is affected little by external capacitance variations, the piezoelectric ceramic plate after lapping has a desired anti-resonance frequency as well as the desired resonance frequency.

Thus, the present invention, is effective in that the piezoelectric ceramic resonator can be manufactured by very simple and practical procedures.

The above and other objects, features, aspects and advantages of the present invention will become more apparent from an following detailed description of the embodiment thereof, with reference to the drawing.

DESCRIPTION OF AN EMBODIMENT OF THE INVENTION

Figure 1:
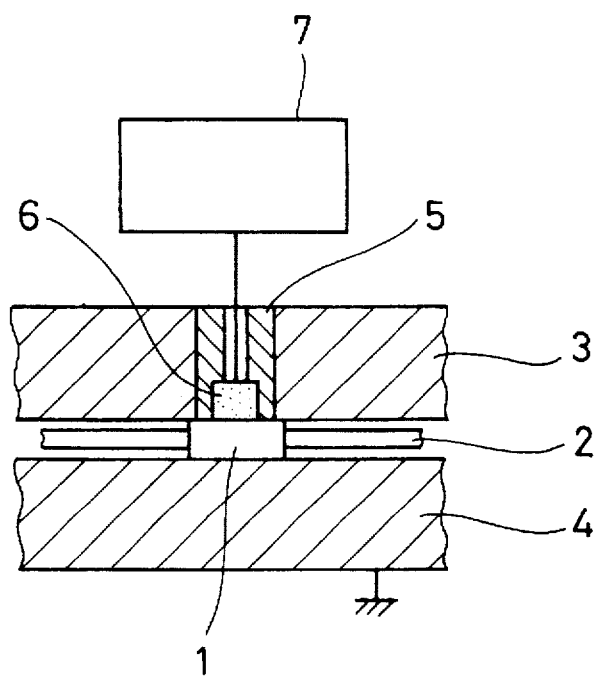
FIG. 1 is an explanatory view showing a configuration of essential portions of a lapping machine used for lapping a piezoelectric ceramic plate.

FIG. 1 is an explanatory view showing a configuration of essential portions of a lapping machine used for lapping a piezoelectric ceramic plate. The lapping machine 10 is for adjusting an anti-resonance frequency of the piezoelectric ceramic plate 1 by lapping the same to adjust the thickness thereof. In this embodiment, the piezoelectric ceramic plate 1 is formed of, for example, zirconate titanate or barium titanate and a homogeneous material is used. The piezoelectric ceramic plate 1 is polarized beforehand.

The lapping machine 10 includes an upper lapping surface plate 3 and a lower lapping surface plate 4. Between the upper and lower lapping surface plates 3, 4, a sun gear(not shown) and an internal gear(not shown) are provided. Between the sun gear and the internal gear, a carrier 2 is installed as a work holder for holding the piezoelectric ceramic plate 1 being lapped. In this case, the carrier 2 has a hole(not shown) having a shape corresponding to the piezoelectric ceramic plate 1, and the piezoelectric ceramic plate 1 is held in the hole. The carrier 2 is thinner than the piezoelectric ceramic plate 1 and has a planetary gear-shaped configuration. The carrier 2 is arranged between the sun gear and the internal gear for independent rotation while engaging therewith.

At the predetermined position of the upper lapping surface plate 3, an electrode 6 is mounted via an insulation material 5. The electrode 6 is mounted on the upper lapping surface plate 3 in such a manner that its end portion is disposed flush with the lapping surface of the lapping surface plate 3.

Furthermore, the lapping machine 10 includes a network analyzer 7 connected and electrically to the electrode 6. The network analyzer 7 functions to measure the anti-resonance frequency of the piezoelectric ceramic plate 1, and an output signal corresponding to the anti-resonance frequency variation is outputted to a control means for controlling a driving system of the carrier 2 from the network analyzer 7. In this embodiment, as the control means for controlling the driving system of the carrier 2, a microcomputer(not shown) for driving system control is used.

The microcomputer carries out a program for stopping the operation of the driving system in response to the output signal from the network analyzer 7 showing that the anti-resonance frequency of the piezoelectric ceramic plate 1 has reached a desired value.

When it is detected by the network analyzer 7 that, the anti-resonance frequency of the piezoelectric ceramic plate 1 during the lapping work has reached the desired value, according to the output signal indication of the same, the microcomputer stops the rotation of the carrier 2. The anti-resonance frequency of the piezoelectric ceramic plate 1 at this time is set, in view of the fact that it has a predetermined relation to the desired resonance frequency, according to the research by the inventor of the present invention as mentioned before.

The above, an embodiment of the method of manufacturing the piezoelectric ceramic resonator according to the present invention comprises, the steps of adjusting the anti-resonance frequency by lapping the piezoelectric ceramic plate 1, which has been polarized, while measuring the anti-resonance frequency fa thereof. In operation, first, a desired polarization is performed on the piezoelectric ceramic plate 1 consisting of a homogeneous material prepared beforehand. Then, by holding the polarized piezoelectric ceramic plate 1 on the carrier 2 and incorporating the carrier 2 between the sun gear and the internal gear, and after arranging the upper lapping surface plate 3 and the lower lapping surface plate 4, the piezoelectric ceramic plate 1 is lapped by rotating the carrier 2 while pouring a lapping slurry(not shown).

Whereupon, the anti-resonance frequency of the piezoelectric ceramic plate 1 during the lapping work is measured by the network analyzer 7 via the electrode 6 mounted on the upper lapping surface plate 3. An output signal indicating that the anti-resonance frequency of the piezoelectric ceramic plate 1 has reached the desired value is outputted to the microcomputer from the network analyzer 7.

As a result, the rotation of the carrier 2 is stopped according to the instruction from the microcomputer and the lapping work of the piezoelectric ceramic plate 1 is finished. The piezoelectric ceramic plate 1 lapped by the above-mentioned procedures has a desired resonance frequency.

Then by forming an electrode(not shown) on the surface of the lapped ceramic plate 1, a piezoelectric ceramic resonator is completed.

As described in connection with the above-mentioned embodiment, this method of lapping the polarized piezoelectric ceramic plate 1 while measuring the anti-resonance frequency thereof, is effective for manufacturing a piezoelectric resonator having a desired resonance frequency.

According to the inventor's research when a homogeneous material is used as the piezoelectric ceramic plate, there is a relationship between the thickness and anti-resonance frequency of the piezoelectric ceramic plate, namely that the product of the thickness of the piezoelectric ceramic plate multiplied by the anti-resonance frequency becomes constant, and further, its anti-resonance frequency is affected little by external capacitance variations, the anti-resonance frequency during the lapping work is hardly affected by external capacitance variations, the piezoelectric ceramic plate 1 lapped by the lapping machine 10 has both a desired anti-resonance frequency, and therefore a desired resonance frequency.

Thus, according to the disclosed method of manufacturing the piezoelectric ceramic resonator, as compared with the conventional method, a very simple and practical piezoelectric ceramic resonator can be manufactured.

While an embodiment of the present invention has been particularly described and shown, it is to be understood that such description is used merely as an illustration and example rather than a limitation, and the spirit and scope of the present invention is determined solely by the terms of the appended claims.

What is claimed is:

1. A method of manufacturing a piezoelectric ceramic resonator having a desired resonance frequency, comprising the steps of:

preparing a piezoelectric ceramic plate;

polarizing said piezoelectric ceramic plate;

adjusting an anti-resonance frequency of said piezoelectric ceramic plate, by lapping said piezoelectric ceramic plate to adjust a thickness of said piezoelectric ceramic plate, while measuring said anti-resonance frequency of said piezoelectric ceramic plate until said piezoelectric ceramic plate has a desired anti-resonance frequency; and defining a predetermined relationship between said desired resonance frequency and said desired anti-resonance frequency.

2. A method of manufacturing a piezoelectric ceramic resonator in accordance with claim 1, wherein said piezoelectric ceramic plate is made of homogeneous material.

3. A method of manufacturing a piezoelectric ceramic resonator which comprises the steps of:

calculating a difference value based on a difference between an anti-resonance frequency and a resonance frequency of a piezoelectric resonator;

preparing a polarized piezoelectric ceramic plate;

defining a desired resonance frequency of the piezoelectric ceramic plate;

calculating a desired anti-resonance frequency of the piezoelectric plate by combining said difference value with said desired resonance frequency of the piezoelectric plate; and lapping said piezoelectric ceramic plate in a direction of a thickness of said piezoelectric ceramic plate, while measuring the anti-resonance frequency thereof, until the anti-resonance frequency of the piezoelectric ceramic plate reaches said desired anti-resonance frequency.

4. A method of manufacturing a piezoelectric ceramic resonator in accordance with claim 3, wherein said piezoelectric ceramic plate is made of homogeneous material.

* * * * *